US011925095B2

(12) United States Patent
Jin et al.

(10) Patent No.: US 11,925,095 B2
(45) Date of Patent: Mar. 5, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Meng Jin, Wuhan (CN); Lei Lv, Wuhan (CN); Tao Yuan, Wuhan (CN); Jinchang Huang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 468 days.

(21) Appl. No.: 17/298,508

(22) PCT Filed: Apr. 12, 2021

(86) PCT No.: PCT/CN2021/086452
§ 371 (c)(1),
(2) Date: May 28, 2021

(87) PCT Pub. No.: WO2022/188234
PCT Pub. Date: Sep. 15, 2022

(65) Prior Publication Data
US 2023/0354676 A1 Nov. 2, 2023

(30) Foreign Application Priority Data
Mar. 12, 2021 (CN) .......................... 202110271696.1

(51) Int. Cl.
*H10K 59/80* (2023.01)
*H10K 59/12* (2023.01)

(52) U.S. Cl.
CPC . *H10K 59/80522* (2023.02); *H10K 59/80524* (2023.02); *H10K 59/12* (2023.02)

(58) Field of Classification Search
CPC ........ H10K 59/12; H10K 59/60; H10K 59/65; H10K 59/121; H10K 59/122;
(Continued)

(56) References Cited

U.S. PATENT DOCUMENTS

2014/0361260 A1* 12/2014 Kim ..................... H10K 59/122
438/23
2021/0280825 A1* 9/2021 Beon ...................... H10K 59/65
2021/0313539 A1* 10/2021 Jeon ..................... H10K 59/353

FOREIGN PATENT DOCUMENTS

| CN | 1612650 A | 5/2005 |
| CN | 102569670 A | 7/2012 |

(Continued)

OTHER PUBLICATIONS

International Search Report in International application No. PCT/CN2021/086452, dated Dec. 17, 2021.
(Continued)

*Primary Examiner* — Brook Kebede
(74) *Attorney, Agent, or Firm* — PV IP PC; Wei Te Chung; Zhigang Ma

(57) ABSTRACT

The present application discloses a display panel and a display device. The display panel includes pixel areas and transmitting areas in a first display area. The display panel further includes a light-emitting unit layer including light-emitting units, an auxiliary layer, a first electrode layer covering the light-emitting unit layer and at least part of the auxiliary layer, and a transparent auxiliary electrode layer at least covering part of the auxiliary layer and electrically connected to the first electrode layer. A thickness of the first
(Continued)

electrode layer on the auxiliary layer is less than a thickness of the first electrode layer on the light-emitting unit layer.

20 Claims, 5 Drawing Sheets

(58) Field of Classification Search
CPC .. H10K 59/124; H10K 59/131; H10K 59/353; H10K 59/80522; H10K 59/80524; H10K 50/822; H10K 50/844; H10K 50/868
See application file for complete search history.

(56) References Cited

FOREIGN PATENT DOCUMENTS

| | | |
|---|---|---|
| CN | 103489890 A | 1/2014 |
| CN | 104347669 A | 2/2015 |
| CN | 104377227 A | 2/2015 |
| CN | 104425747 A | 3/2015 |
| CN | 104953044 A | 9/2015 |
| CN | 106098955 A | 11/2016 |
| CN | 108496260 A | 9/2018 |
| CN | 110890477 A | 3/2020 |
| CN | 111384284 A | 7/2020 |
| CN | 112054048 A | 12/2020 |
| WO | 2020105015 A1 | 5/2020 |

OTHER PUBLICATIONS

Written Opinion of the International Search Authority in International application No. PCT/CN2021/086452, dated Dec. 17, 2021.
Chinese Office Action issued in corresponding Chinese Patent Application No. 202110271696.1 dated Mar. 22, 2022, pp. 1-7.

\* cited by examiner

DISPLAY PANEL AND DISPLAY DEVICE

RELATED APPLICATIONS

This application is a Notional Phase of PCT Patent Application No. PCT/CN2021/086452 having international filing date of Apr. 12, 2021, which claims the benefit of priority of Chinese Patent Application No. 202110271696.1 filed on Mar. 12, 2021. The contents of the above applications are all incorporated by reference as if fully set forth herein in their entirety.

FIELD OF INVENTION

The present application is related to the field of display technology and specifically to a display panel and a display device.

BACKGROUND OF INVENTION

In current camera under panel (CUP) display technology, its display panel includes a first display area configured to display and photograph, and a second display area configured to display only. In order to increase a photograph effect of a camera, cathodes in transmitting areas are usually thinned or removed to increase a transmittance of the display panel in the transmitting areas.

However, thinning the cathodes in the transmitting areas increases resistivity of the cathodes in the transmitting areas. In addition, removing the cathodes in the transmitting areas causes the cathodes to be discontinuous in the transmitting areas and increases the resistivity of the cathodes, and a voltage drop of the display panel is increased accordingly.

SUMMARY OF INVENTION

The present application provides a display panel and a display device to reduce a voltage drop of the display panel.

The display panel provided by an embodiment of the present application includes a first display area and a second display area. A transmittance of the first display area is greater than a transmittance of the second display area. The display panel further includes pixel areas and transmitting areas positioned between the pixel areas in the first display area. The display panel further includes:
- a light-emitting unit layer including light-emitting units disposed in the pixel areas;
- an auxiliary layer disposed in the transmitting areas;
- a first electrode layer covering the light-emitting unit layer and at least part of the auxiliary layer, wherein a thickness of the first electrode layer on the auxiliary layer is less than a thickness of the first electrode layer on the light-emitting unit layer; and
- a transparent auxiliary electrode layer at least covering part of the auxiliary layer and electrically connected to the first electrode layer.

Optionally, in an embodiment of the present application, the transparent auxiliary electrode layer completely covers the auxiliary layer.

Optionally, in an embodiment of the present application, the transparent auxiliary electrode layer completely covers the first electrode layer.

Optionally, in an embodiment of the present application, the transparent auxiliary electrode layer extends into the second display area.

Optionally, in an embodiment of the present application, the transparent auxiliary electrode layer includes a plurality of transparent auxiliary electrodes arranged at intervals. The auxiliary layer includes a plurality of auxiliary portions arranged at intervals. Each of the auxiliary portions is positioned in a corresponding one of the transmitting areas. Each of the transparent auxiliary electrodes at least covers part of a corresponding one of the auxiliary portions and part of the first electrode layer on the corresponding one of the auxiliary portions.

Optionally, in an embodiment of the present application, each of the transparent auxiliary electrodes completely covers the corresponding one of the auxiliary portions and the first electrode layer positioned on the corresponding one of the auxiliary portions.

Optionally, in an embodiment of the present application, each of the transparent auxiliary electrodes further covers part of the first electrode layer positioned at a periphery of the corresponding one of the auxiliary portions.

Optionally, in an embodiment of the present application, a distance between an edge of each of the transparent auxiliary electrodes and an edge of the corresponding one of the auxiliary portions ranges from 2 to 5 micrometers.

Optionally, in an embodiment of the present application, each of the auxiliary portions includes a stage portion and an edge portion positioned at edges of the stage portion. A thickness of the edge portion gradually decreases in a direction away from the stage portion. The first electrode layer at least covers part of the edge portion. A thickness of the first electrode layer gradually decreases on the edge portion in a direction in which the thickness of the edge portion increases.

Optionally, in an embodiment of the present application, on the auxiliary layer, the first electrode layer covers part of the edge portion.

Optionally, in an embodiment of the present application, on the auxiliary layer, the first electrode layer completely covers the edge portion.

Optionally, in an embodiment of the present application, on the auxiliary layer, the first electrode layer completely covers the edge portion and the stage portion.

Optionally, in an embodiment of the present application, the display panel further includes a protective layer disposed between the first electrode layer and the transparent auxiliary electrode layer. The protective layer includes a plurality of protective portions arranged at intervals. Each of the protective portions is positioned in a corresponding one of the pixel areas. The light-emitting unit layer includes the light-emitting units arranged at intervals. Each of the light-emitting units is positioned in the corresponding one of the pixel areas. Each of the protective portions corresponds to each of the light-emitting units.

Optionally, in an embodiment of the present application, a projection of each of the light-emitting units on the first electrode layer is positioned in a projection of each of the protective portions on the first electrode layer. An area of each the light-emitting units is less than or equal to an area of each of the protective portions.

Optionally, in an embodiment of the present application, the display panel further includes a pixel defining layer patterned to form a plurality of pixel openings arranged at intervals. Each of the pixel openings is positioned in a corresponding one of the pixel areas. The auxiliary layer includes a plurality of auxiliary portions arranged at intervals. Each of the auxiliary portions is positioned in a corresponding one of the transmitting areas, and a distance between an edge of each of the auxiliary portions and an edge of adjacent one of the pixel openings ranges from 2 to 5 micrometers.

Optionally, in an embodiment of the present application, a thickness of the transparent auxiliary electrode layer ranges from 20 to 200 nanometers.

Optionally, in an embodiment of the present application, a refractive index of the transparent auxiliary electrode layer ranges from 1.8 to 2.1.

The display device further provided by an embodiment of the present application includes a display panel. The display panel includes a first display area and a second display area. A transmittance of the first display area is greater than a transmittance of the second display area.

The display panel further includes pixel areas and transmitting areas positioned between the pixel areas in the first display area. The display panel further includes:

pixel areas and transmitting areas positioned between the pixel areas in the first display area;

a light-emitting unit layer including light-emitting units disposed in the pixel areas;

an auxiliary layer disposed in the transmitting areas;

a first electrode layer covering the light-emitting unit layer and at least part of the auxiliary layer, wherein a thickness of the first electrode layer on the auxiliary layer is less than a thickness of the first electrode layer on the light-emitting unit layer; and a transparent auxiliary electrode layer at least covering part of the auxiliary layer and electrically connected to the first electrode layer.

Optionally, in an embodiment of the present application, the transparent auxiliary electrode layer completely covers the auxiliary layer.

Optionally, in an embodiment of the present application, the transparent auxiliary electrode layer completely covers the first electrode layer.

The present application provides the display panel and the display device. The display panel includes the first display area and the second display area. The transmittance of the first display area is greater than the transmittance of the second display area. The display panel further includes the pixel areas and the transmitting areas positioned between the pixel areas in the first display area. The display panel further includes a light-emitting unit layer including light-emitting units disposed in the pixel areas; an auxiliary layer disposed in the transmitting areas; a first electrode layer covering the light-emitting unit layer and at least part of the auxiliary layer, wherein a thickness of the first electrode layer on the auxiliary layer is less than a thickness of the first electrode layer on the light-emitting unit layer; and a transparent auxiliary electrode layer at least covering part of the auxiliary layer and electrically connected to the first electrode layer. In the present application, the transparent auxiliary electrode layer is added on the first electrode layer, and the transparent auxiliary electrode layer completely covers the auxiliary layer and is electrically connected to the first electrode layer, so that the transparent auxiliary electrode layer can assist the first electrode layer to provide electrical signals for the display panel. A conductivity of the first electrode layer is increased without affecting a transmittance of the display panel in the transmitting areas, and a voltage drop of the display panel is reduced.

DESCRIPTION OF DRAWINGS

The following describes specific embodiments of the present application in detail with reference to the accompanying drawings, which will make technical solutions and other beneficial effects of the present application obvious.

DETAILED DESCRIPTION OF EMBODIMENTS

The present application provides a display panel, a manufacturing method thereof, and a display device to reduce a voltage drop of the display panel. Detailed descriptions are given below. It should be explained that an order of the descriptions in the following embodiments is not intended to limit a preferred order of the embodiments.

Figure 1:
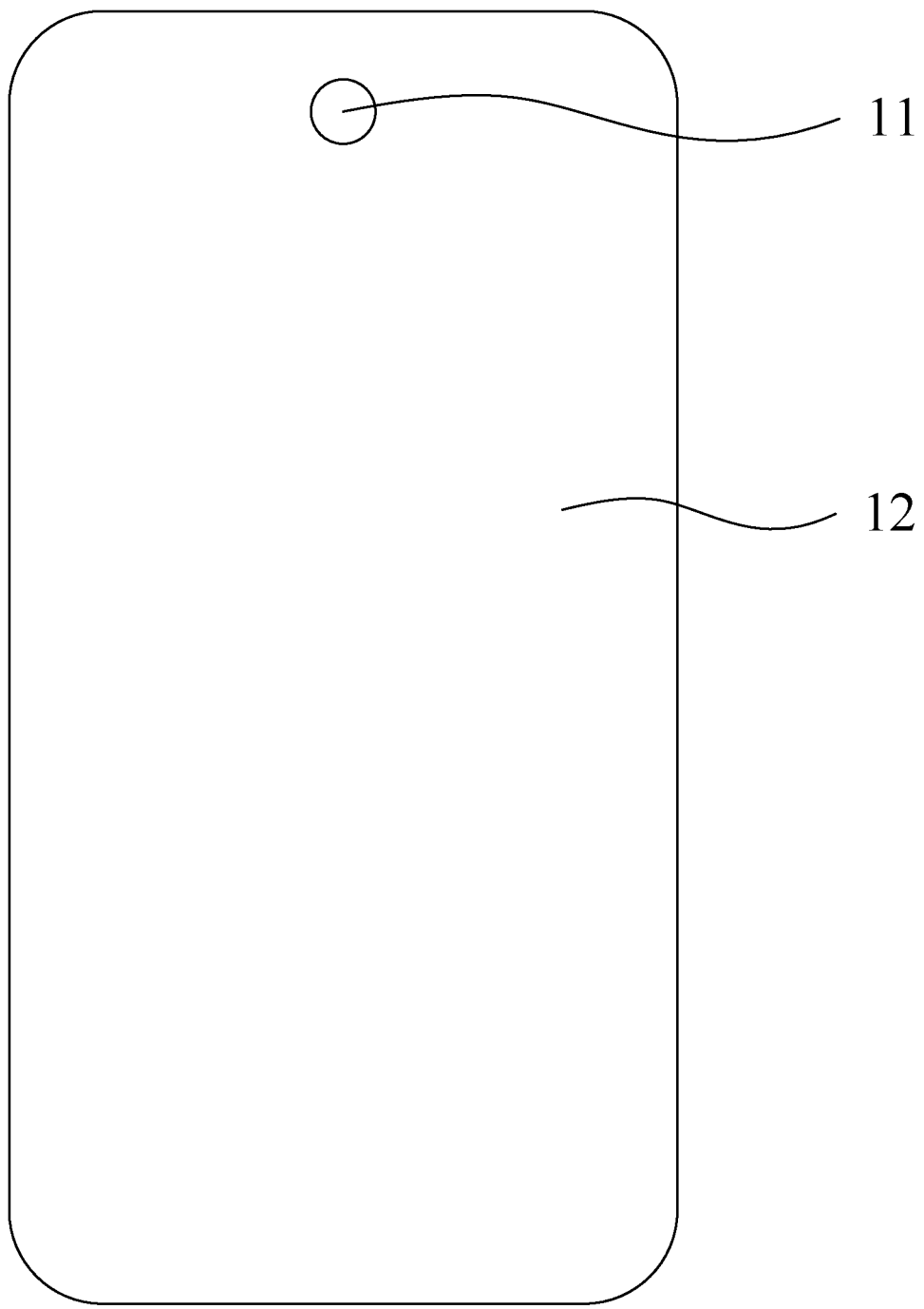
FIG. 1 is a structural schematic diagram of a first plane view of a display panel provided by an embodiment of the present application.
Figure 2:
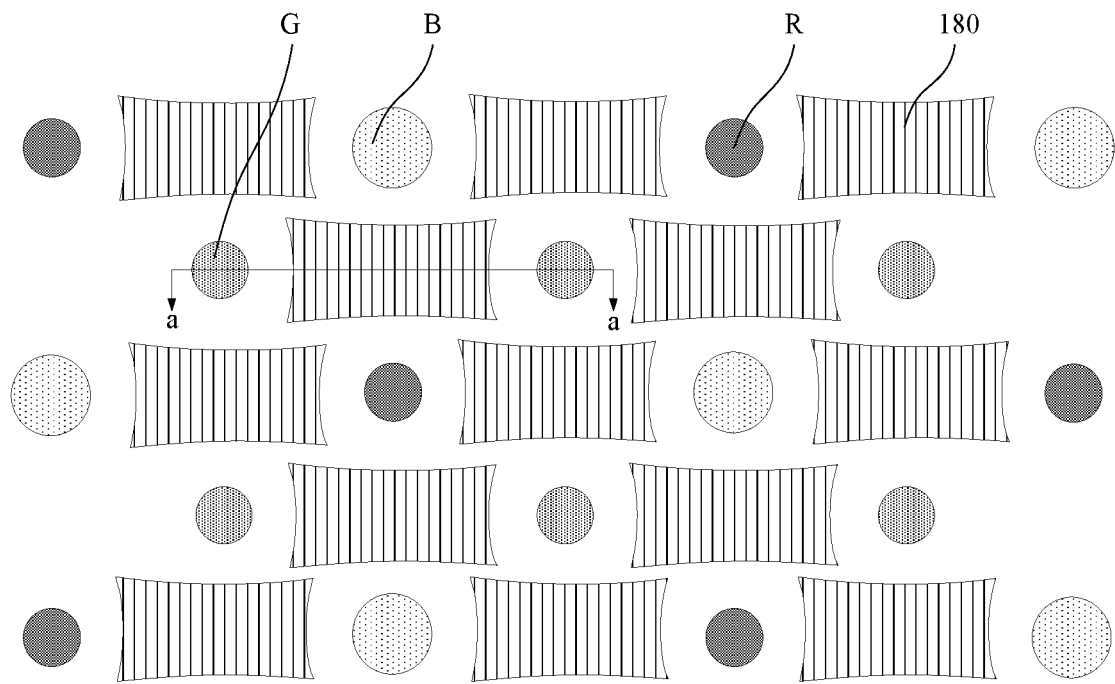
FIG. 2 is a structural schematic diagram of a second plane view of the display panel provided by an embodiment of the present application.
Figure 3:
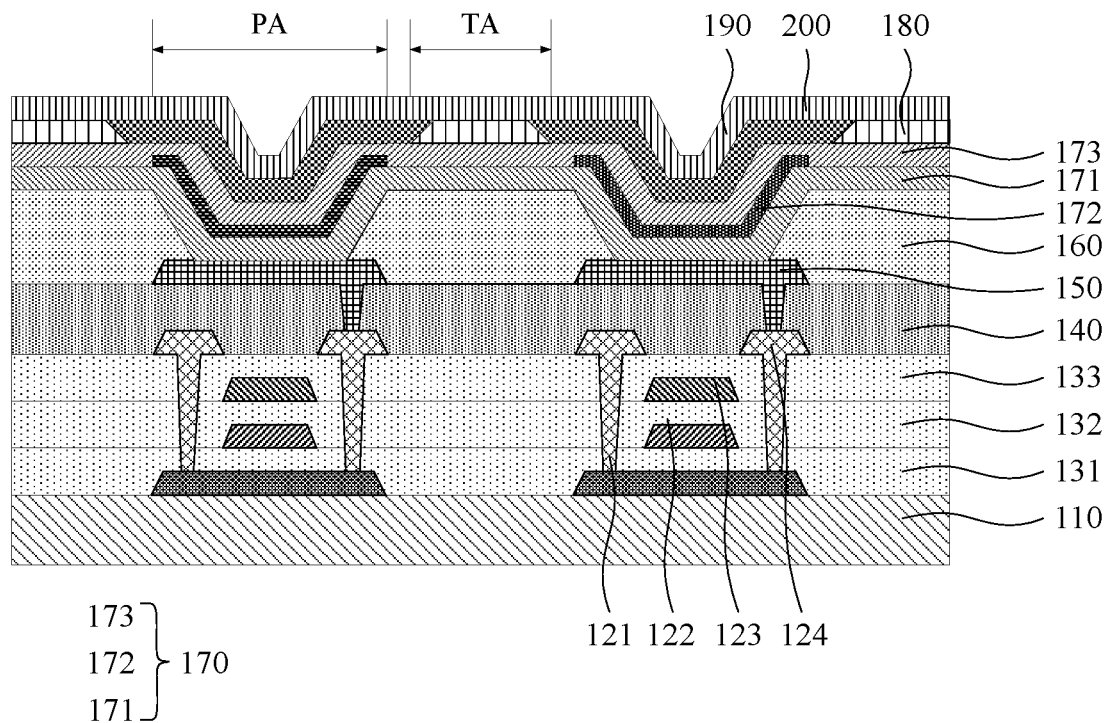
FIG. 3 is a structural schematic diagram of a first cross-sectional view of the display panel provided by an embodiment of the present application.
Figure 4:
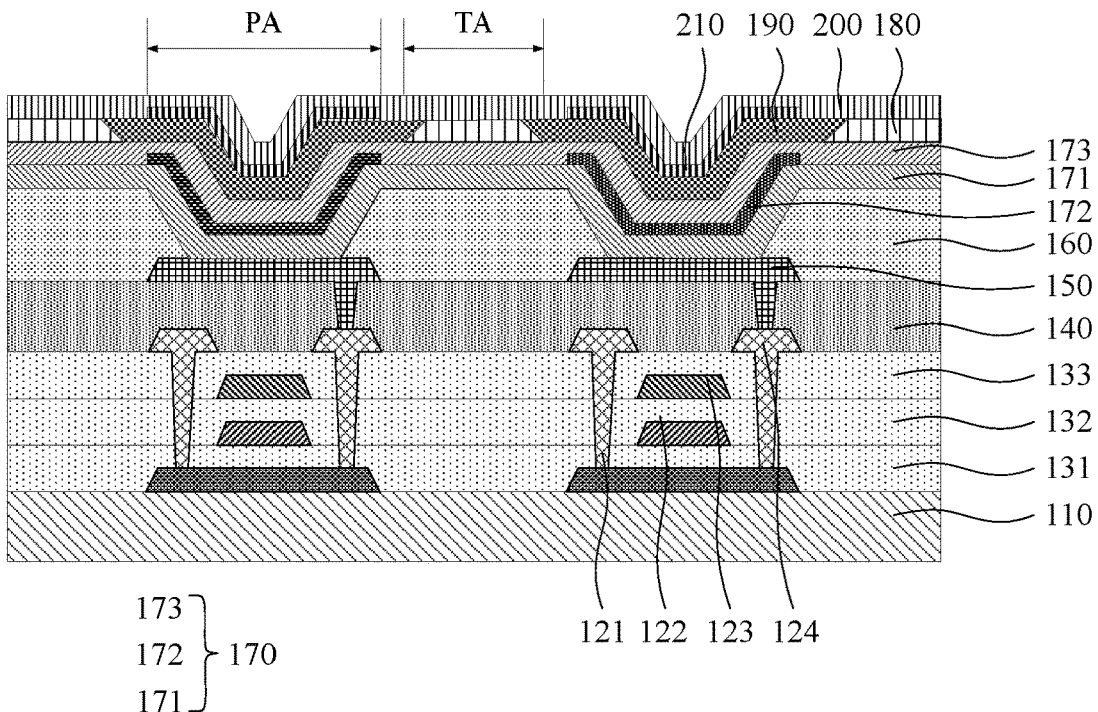
FIG. 4 is a structural schematic diagram of a second cross-sectional view of the display panel provided by an embodiment of the present application.
Figure 5:
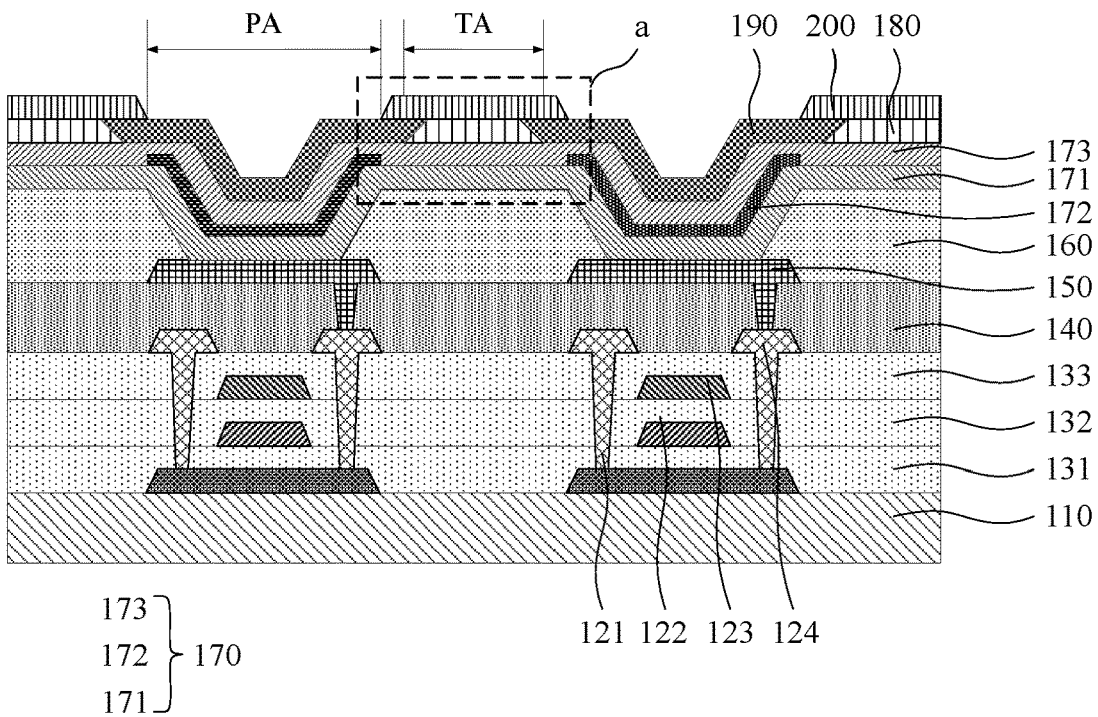
FIG. 5 is a structural schematic diagram of a third cross-sectional view of the display panel provided by an embodiment of the present application.

In an embodiment, Please refer to FIGS. 1-5. FIG. 1 is a structural schematic diagram of a first plane view of a display panel provided by an embodiment of the present application. FIG. 2 is a structural schematic diagram of a second plane view of the display panel provided by an embodiment of the present application, and specifically is a structural schematic diagram of a partial plane view of the first display area of the display panel provided by the embodiment of the present application. FIG. 3 is a structural schematic diagram of a first cross-sectional view of the display panel provided by an embodiment of the present application, and specifically is a partial cross-sectional schematic diagram of the first display area of the display panel provided by the embodiment of the application, that is, a structural schematic diagram of a cross-sectional view along a line aa in FIG. 2. FIG. 4 is a structural schematic diagram of a second cross-sectional view of the display panel provided by an embodiment of the present application. FIG. 5 is a structural schematic diagram of a third cross-sectional view of the display panel provided by an embodiment of the present application. As shown in the drawings, the display panel 10 provided by an embodiment of the present application includes a first display area 11 and a second display area 12. A transmittance of the first display area 11 is greater than a transmittance of the second display area 12. The display panel 10 further includes pixel areas PA and transmitting areas TA positioned between the pixel areas PA in the first display area 11. The display panel 10 further includes a light-emitting unit layer 170, an auxiliary layer 180, a first electrode layer 190, and a transparent auxiliary electrode layer 200. The auxiliary layer 180 is positioned in the transmitting areas TA. The first electrode layer 190 covers the light-emitting unit layer 170 and at least part of the auxiliary layer 180. A thickness of the first electrode layer 190 on the auxiliary layer 180 is less than a thickness of the first electrode layer on the light-emitting unit layer 170. The transparent auxiliary electrode layer 200 is disposed on the first electrode layer 190, at least covers part of the auxiliary layer 180, and is electrically connected to the first electrode layer 190.

An embodiment of the present application provides the display panel. The display panel adds the transparent auxiliary electrode layer on the auxiliary layer, and the transparent auxiliary electrode layer completely covers the auxiliary layer and is electrically connected to the first electrode layer, so that the transparent auxiliary electrode layer can assist the first electrode layer to provide electrical signals for the display panel. A conductivity of the first electrode layer is increased without affecting a transmittance of the display panel in the transmitting areas, and the voltage drop of the display panel is reduced.

The display panel provided by an embodiment of the present application is further explained below with specific embodiments in conjunction with drawings. The following embodiments are only to illustrate the display panel provided by the present application and are not intended to limit the display panel provided by the present application. Any display panel that conforms to an inventive concept of the present application is within the protection scope of the present application.

In an embodiment, as shown in FIGS. 3-5, the display panel provided by an embodiment of the present application specifically includes an array substrate, a second electrode layer 150, a pixel defining layer 160, the light-emitting unit layer 170, the auxiliary layer 180, the first electrode layer 190, and the transparent auxiliary electrode layer 200.

The array substrate includes a substrate 110, a semiconductor active layer 121, a first insulating layer 131, a first gate layer 122, a second insulating layer 132, a second gate layer 123, a third insulating layer 133, a source/drain layer 124, and a planarization layer 140 sequentially disposed from a bottom to a top. The substrate 110 can be a rigid substrate or a flexible substrate. The rigid substrate is generally a glass substrate. The flexible substrate usually includes a first organic substrate, an inorganic substrate, and a second inorganic substrate. The semiconductor active layer 121 is patterned to form active areas of thin-film transistors. A material of the semiconductor active layer 121 can be an oxide semiconductor material, a polysilicon material, or a single crystal silicon material. The first gate layer 122 is patterned to form first gates of the thin-film transistors. The second gate layer 123 is patterned to form second gates of the thin-film transistors. The source/drain layer 124 is patterned to form sources and drains of the thin-film transistors. The thin-film transistors and signal lines constitute a driving circuit of the display panel 10, which is configured to drive the light-emitting unit layer 170 for light-emitting display. The first insulating layer 131 is disposed between the semiconductor active layer 121 and the first gate layer 122. The second insulating layer 132 is disposed between the first gate layer 122 and the second gate layer 123. The third insulating layer 133 is disposed between the second gate layer 123 and the source/drain layer 124. The first insulating layer 131, the second insulating layer 132, and the third insulating layer 133 are respectively configured to isolate two conductive layers adjacent to each of them. The planarization layer 140 is configured to planarize the array substrate and provide a flat substrate for manufacturing the second electrode layer 150 on the planarization layer 140. A material of the planarization layer 140 is generally an organic material.

The second electrode layer 150 is formed on the array substrate and is patterned to form second electrodes 150 spaced apart from each other and independent of each other. The second electrodes 150 are positioned in the pixel areas PA of the display panel 10.

The pixel defining layer 160 is formed on the second electrode layer 150 and is patterned to form pixel openings arranged at intervals. The pixel openings are positioned in the pixel areas PA, correspond to the second electrodes 150, and expose the second electrodes 150.

The light-emitting unit layer 170 is formed on the second electrode layer 150 and the pixel defining layer 160. The light-emitting unit layer 170 includes a first light-emitting unit layer 171, a second light-emitting unit layer 172, and a third light-emitting unit layer 173. When the first electrode layer 190 is a common electrode layer, and when the second electrode layer 150 is a pixel electrode layer, the first light-emitting unit layer 171 is a hole transport layer, and the third light-emitting unit layer 173 is an electron transport layer. When the first electrode layer 190 is the pixel electrode layer, and when the second electrode layer 150 is the common electrode layer, the first light-emitting unit layer 171 is the electron transport layer, and the third light-emitting unit layer 173 is the hole transport layer. This embodiment of the present application takes the first electrode layer 190 being the common electrode layer and the second electrode layer 150 being the pixel electrode layer as an example. The hole transport layer is a material with high hole mobility, high thermal stability, and good electron and exciton blocking ability. A material of the hole transport layer is generally one or more of 2TNATA, NPB, and TAPC. The electron transport layer is a material with high electron mobility, high thermal stability, and good hole and exciton blocking ability. A material of the electron transport layer is one or more of TPBi, BPhen, and TmPyPB. The second light-emitting unit layer 172 is a light-emitting material layer including a red light-emitting material layer, a green light-emitting material layer, and a blue light-emitting material layer. The red light-emitting material layer, the green light-emitting material layer, and the blue light-emitting material layer are respectively arranged in different pixel openings at intervals to emit light from corresponding light-emitting units. As shown in FIG. 2, they include red light-emitting units R, green light-emitting units G, and blue light-emitting units B. In an embodiment of the present application, a structure of the light-emitting units can be a structure shown in FIG. 3 or can be other structures well known in prior art, which is not limited herein. In order to increase an efficiency of electron and hole injection into the light-emitting material layer, the first light-emitting unit layer 171 can further be a composite film layer of a hole transport layer and a hole injection layer, and the hole injection layer is disposed between the hole transport layer and the light-emitting material layer. The third light-emitting unit layer 173 can further be a composite film layer of the electron transport layer and the electron injection layer, and the electron injection layer is positioned between the electron transport layer and the light-emitting material layer. The first light-emitting unit layer 171 is formed as a whole layer, covers the pixel areas PA and the transmitting areas TA, is deposited on the pixel defining layer 160, covers the pixel openings, and is in contact with the second electrodes 150. The second light-emitting unit layer 172 is positioned in the pixel areas PA (i.e., the light-emitting units corresponding to the pixel areas), is deposited on the first light-emitting unit layer 171, and corresponds to the second electrodes 150. The third light-emitting unit layer 173 is formed as a whole layer, covers the pixel areas PA and transmitting areas TA, and is deposited on the first light-emitting unit layer 171 and the second light-emitting unit layer 172.

Figure 6:
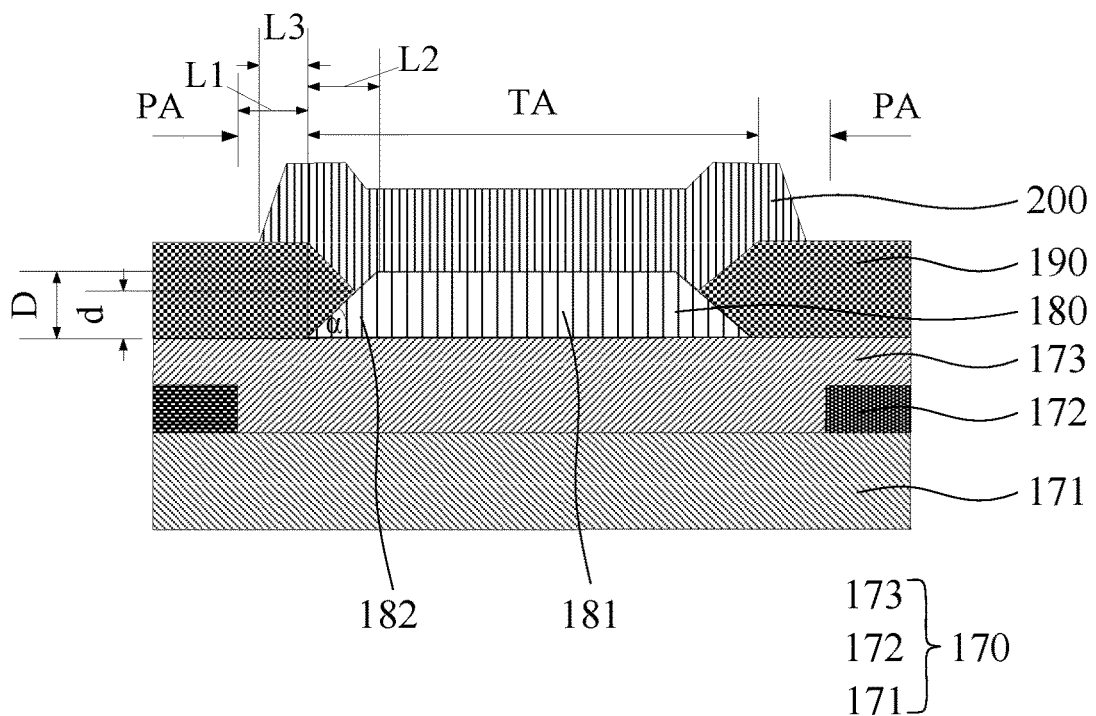
FIG. 6 is a structural schematic diagram of a fourth cross-sectional view of the display panel provided by an embodiment of the present application.
Figure 7:
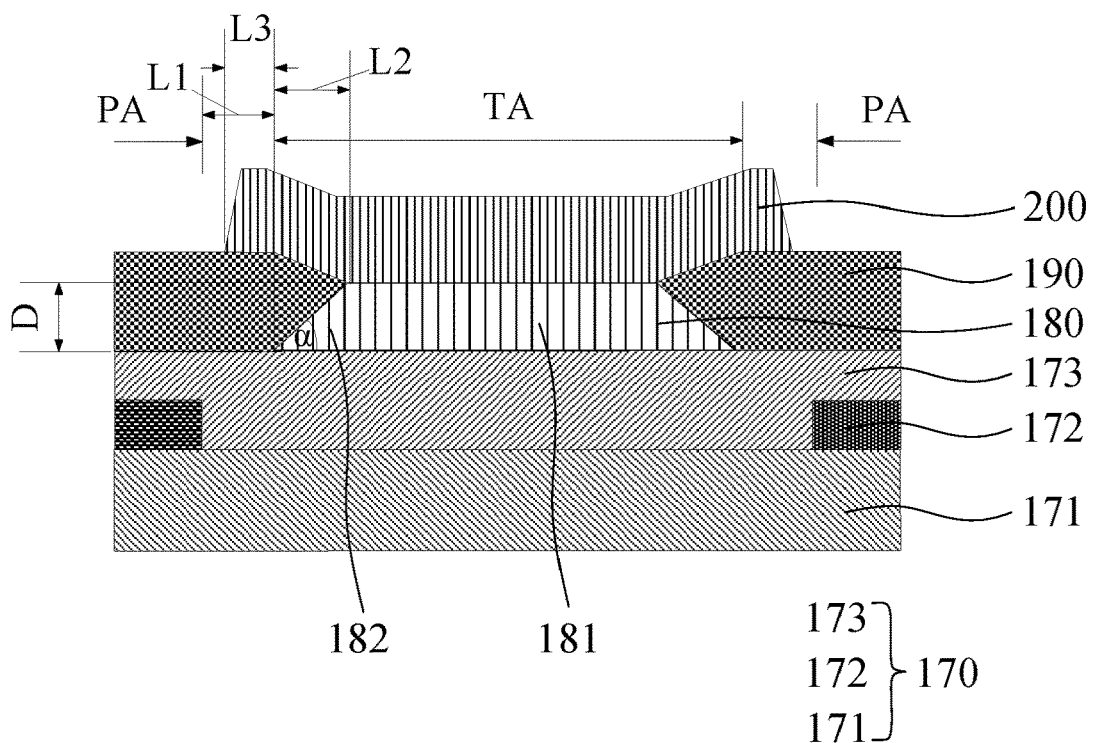
FIG. 7 is a structural schematic diagram of a fifth cross-sectional view of the display panel provided by an embodiment of the present application.
Figure 8:
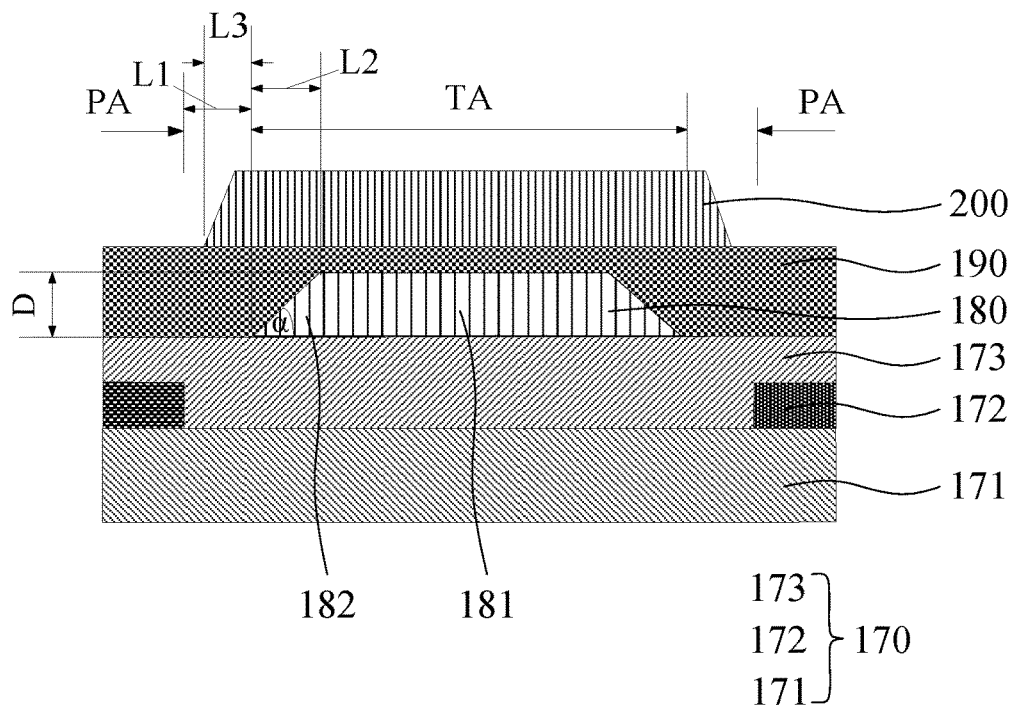
FIG. 8 is a structural schematic diagram of a sixth cross-sectional view of the display panel provided by an embodiment of the present application.

The auxiliary layer 180 is disposed on the third light-emitting unit layer 173 and is patterned to form auxiliary portions 180 spaced apart and independent of each other. Each of the auxiliary portions 180 is positioned in a corresponding one of the transmitting areas TA. Please further refer to FIGS. 6-8. FIG. 6 is a structural schematic diagram of a fourth cross-sectional view of the display panel provided by an embodiment of the present application, and specifically is a structural schematic diagram of a first partial enlarged view of an area a in FIG. 5. FIG. 7 is a structural schematic diagram of a fifth cross-sectional view of the display panel provided by an embodiment of the present application, and specifically is a structural schematic diagram of a second partial enlarged view of an area a in FIG. 5. FIG. 8 is a structural schematic diagram of a sixth cross-sectional view of the display panel provided by an embodiment of the present application, and specifically is a structural schematic diagram of a third partial enlarged view of an area a in FIG. 5. As shown in FIGS. 6-8, each of the auxiliary portions 180 is positioned in the corresponding one of the transmitting areas TA, and a distance L1 between an edge of each of the auxiliary portions 180 and an edge of adjacent one of the pixel openings ranges from 2 to 5 micrometers. A projection of the auxiliary portions 180 on the substrate 110 does not overlap a projection of the second electrodes 150 on the substrate. Each of the auxiliary portions 180 includes a stage portion 181 and an edge portion 182 positioned at edges of the stage portion 181. A thickness of the edge portion 182 gradually decreases in a direction away from the stage portion 181. A width L2 of a projection of the edge portion 182 on the third light-emitting unit layer 173 ranges from 2 to 5 micrometers. A contact angle α between the auxiliary layer 180 and the third light-emitting unit layer 173 ranges from 0 to 90 degrees. As shown in FIGS. 4 to 8, in an embodiment, sides of each of the auxiliary portions 180 are straight lines connecting a top surface and a bottom surface of each of the auxiliary portions 180, and a cross-section of each of the auxiliary portions 180 is a regular trapezoidal structure. In other embodiments, the sides of each of the auxiliary portions 180 can also be a curved line, an arc line, or a broken line connecting the top surface and the bottom surface of each of the auxiliary portions 180, which means that a shape of each of the auxiliary portions 180 is an irregular shaped structure. In the display panel provided by an embodiment of the present application, all structures of each of the auxiliary portions 180 that satisfy each of the auxiliary portions 180 whose thickness gradually decreases in the direction away from the stage portion 181 are within a technical scope of the present application. In the display panel provided by an embodiment of the present application, a material of the auxiliary layer 180 is a transparent anti-adhesion material, specifically is a material having a weak adhesion force with the first electrode layer 190 and surface energy mismatching with the first electrode layer 190, and includes, but is not limited to N,N'-diphenyl-N,N'-bis(9-phenyl-9H-carbazol-3-yl)biphenyl-4,4'-diamine, N-(biphenyl-4-yl)-9,9-dimethyl-N-(4-(9-phenyl-9H-carbazol-3-yl)phenyl)-9H-fluoren-2-amine, 2-(4-(9,10-bis(naphthalen-2-yl)anthracene-2-yl)phenyl)-1-phenyl-1H-benzo-[D]imidazole, 4,4',4"-Tris(N-3-methylphenyl-N-phenylamino)triphenylamine, N,N'-bis(1-naphthyl)-N,N'-diphenyl[1,1'-biphenyl]-4,4'-diamine or 4,4'-bis[N-(3-methylphenyl)-N-phenylamino)biphenyl, BAlq (bis(2-methyl-8-hydroxyquinoline)-4-(phenylphenoxy)aluminum), and TAZ (3-(biphenyl-4-yl)-5-(4-tert-butylphenyl)-4-phenyl-4H-1,2,4-triazole).

The first electrode layer 190 is disposed on the third light-emitting unit layer 173 and the auxiliary layer 180 and covers the third light-emitting unit layer 173. The first electrode layer 190 is a non-transparent electrode layer, which includes a function of reflecting light emitted by the second light-emitting unit layer 172 and further includes a function of blocking external light from entering the display panel 10 through the transmitting areas TA. In an embodiment, the first electrode layer 190 is a common electrode layer, which can be made of metals with low work function, including silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca), and preferably, the first electrode layer 190 is a magnesium or magnesium alloy metal layer.

As shown in FIGS. 6-8, the material of the auxiliary layer 180 is the anti-adhesion material, and the anti-adhesion material mismatches with a surface energy of a material of the first electrode layer 190. Also, a material of the third light-emitting unit layer 173 is a non-anti-adhesion material, which matches the surface energy of the material of the first electrode layer 190. In this way, an adhesion force of the first electrode layer 190 on the auxiliary layer 180 is less than an adhesion force of the first electrode layer 190 on the third light-emitting unit layer 173. Therefore, the thickness of the first electrode layer 190 on the auxiliary layer 180 is less than the thickness of the first electrode layer 190 on the third light-emitting unit layer 173. Moreover, the adhesion force of the first electrode layer 190 on the auxiliary layer 180 gradually decreases as the thickness of the auxiliary layer 180 increases. When the thickness of the auxiliary layer 180 reaches a certain value d, the adhesion force of the first electrode layer 190 on the auxiliary layer 180 reaches a limit value, and the first electrode layer 190 cannot be attached to the auxiliary layer 180. In other words, the first electrode layer 190 cannot be disposed on the auxiliary layer 180 whose thickness is greater than d. Therefore, the first electrode layer 190 at least covers part of the edge portion 182 of the auxiliary layer 180, the thickness of the first electrode layer 190 on the edge portion 182 gradually decreases in a direction in which the thickness of the edge portion 182 increases, and the thickness of the first electrode layer 190 positioned at edges of the auxiliary layer 180 is same as the thickness of the first electrode layer 190 on the third light-emitting unit layer 173. In summary, by controlling the thickness of the auxiliary layer 180, a deposited thickness of the first electrode layer 190 on the auxiliary layer 180 can be controlled, so that a corresponding portion of the first electrode layer 190 can be removed, or the first electrode layer 190 can be patterned. In the embodiment of the present application, the thickness of the first electrode layer 190 positioned on the third light-emitting unit layer 173 ranges from 100 to 150 nanometers, and a thickness of the stage portion 181 of the auxiliary layer 180 is less than or equal to the thickness of the first electrode layer 190 on the third light-emitting unit layer 173.

In an embodiment, as shown in FIG. 6, a thickness D of the auxiliary layer 180 is greater than a thickness d of the auxiliary layer 180, and the first electrode layer 190 covers part of the edge portion 182 of the auxiliary layer 180. The thickness of the edge portion 182 gradually increases in a direction approaching the stage portion 181, and the adhesion force of the first electrode layer 190 on the edge portion 182 gradually decreases in the direction approaching the stage portion 181, so the thickness of the first electrode layer 190 on the edge portion 182 gradually decreases in the direction approaching the stage portion 181. When the thickness of the edge portion 182 is increased to d, the adhesion force of the first electrode layer 190 on the edge portion 182 is reduced to a limit value, and the first electrode layer 190 cannot be attached to the edge portion 182 whose thickness is greater than d and the stage portion 181 whose thickness is D. When the thickness of the first electrode layer 190 is reduced to zero, the first electrode layer 190 only covers a portion of the edge portion 182 whose thickness is less than or equal to d, and a portion of the edge portion 182 whose thickness is greater than d and the stage portion 181 are not attached with the first electrode layer 190. Because the first electrode layer 190 is not attached to the portion of the edge portion 182 whose thickness is greater than d and the stage portion 181, the first electrode layer 190 is not provided in one of the transmitting areas TA corresponding to them. As a result, a blocking strength of external light of metal reflective electrodes in the transmitting areas TA is reduced, and a transmittance of the transmitting areas TA is increased. Because the first electrode layer 190 is attached to the portion of the edge portion 182 whose thickness is less than or equal to d, the metal reflective electrodes remain in the transmitting areas TA, which can reflect the light emitted by the second light-emitting unit layer 172. As a result, a brightness of the transmitting areas TA is reduced, a brightness difference between the first display area and the second display area is reduced, and a brightness uniformity of the display panel is increased. In addition, because the thickness of the first electrode layer 190 on the edge portion 182 gradually decreases in the direction approaching the stage portion 181, and the thickness of the first electrode layer 190 positioned at the edges of the auxiliary layer 180 is same as the thickness of the first electrode layer 190 on the third light-emitting unit layer 173, the thickness of the first electrode layer 190 smoothly transitions at a junction of one of the pixel areas PA and one of the transmitting areas TA. In addition, the thickness of the first electrode layer 190 in one of the transmitting areas TA gradually decreases in a direction away from one of the pixel areas PA, so the transmittance of the display panel smoothly transitions at the junction of one of the pixel areas PA and one of the transmitting areas TA and gradually increases in the direction away from one of the pixel areas PA. A blocking strength of the first electrode layer 190 to light emitted by the third light-emitting unit layer 173 smoothly transitions at the junction of one of the pixel areas PA and one of the transmitting areas TA, and gradually decreases in the direction away from one of the pixel areas PA, so the brightness uniformity of the display panel is further increased.

In another embodiment, as shown in FIG. 7, a thickness D of the auxiliary layer 180 is greater than a thickness d of the auxiliary layer 180, and the first electrode layer 190 completely covers the edge portion 182 of the auxiliary layer 180 and not covers the stage portion 181 of the auxiliary layer 180. The thickness of the edge portion 182 gradually increases in the direction approaching the stage portion 181, and the adhesion force of the first electrode layer 190 on the edge portion 182 gradually decreases in the direction approaching the stage portion 181, so the thickness of the first electrode layer 190 on the edge portion 182 gradually decreases in the direction approaching the stage portion 181. When the thickness of the edge portion 182 is increased to d, the thickness of the first electrode layer 190 is reduced to zero, the first electrode layer 190 only covers the edge portion 182 and not covers the stage portion 181. Similarly, because the edge portion 182 is not covered by the first electrode layer 190, the transmittance of the transmitting areas TA is increased. Because the edge portion 182 is covered by the first electrode layer 190, the first electrode layer 190 reflects the light emitted by the second light-emitting unit layer 172. As a result, the brightness of the transmitting areas TA is reduced, the brightness difference between the first display area and the second display area is reduced, and the brightness uniformity of the display panel is increased. In addition, because the thickness of the first electrode layer 190 on the edge portion 182 gradually decreases in the direction approaching the stage portion 181, and the thickness of the first electrode layer 190 positioned at the edges of the auxiliary layer 180 is same as the thickness of the first electrode layer 190 on the third light-emitting unit layer 173, the transmittance of the display panel smoothly transitions at the junction of one of the pixel areas PA and one of the transmitting areas TA and gradually increases in the direction away from one of the pixel areas PA. The blocking strength of the first electrode layer 190 to light emitted by the third light-emitting unit layer 173 smoothly transitions at the junction of one of the pixel areas PA and one of the transmitting areas TA, and gradually decreases in the direction away from one of the pixel areas PA, so the brightness uniformity of the display panel is further increased.

In yet another embodiment, as shown in FIG. 8, a thickness D of the auxiliary layer 180 is less than a thickness d of the auxiliary layer 180, and the first electrode layer 190 completely covers the edge portion 182 and the stage portion 182 of the auxiliary layer 180. The thickness of the edge portion 182 gradually increases in the direction approaching the stage portion 181, and the adhesion force of the first electrode layer 190 on the edge portion 182 gradually decreases in the direction approaching the stage portion 181, so the thickness of the first electrode layer 190 on the edge portion 182 gradually decreases in the direction approaching the stage portion 181. When the thickness of the edge portion 182 is increased to D, because D is less than d, the first electrode layer 190 can continue to be attached to one of the auxiliary portions 180 whose thickness is D. Therefore, the first electrode layer 190 completely covers the edge portion 182 and the stage portion 181, and the thickness of the first electrode layer 190 covering the stage portion 181 is less than that of the edge portion 182. In this way, the first electrode layer 190 with a thinning thickness provided on the stage portion 181 and the edge portion 182 increases the transmittance of the transmitting areas TA. The first electrode layer 190 covers the stage portion 181 and the edge portion 182 and reflects the light emitted by the second light-emitting unit layer 172, which further reduces the brightness of the transmitting areas TA, reduces the brightness difference between the first display area and the second display area, and increases the brightness uniformity of the display panel. In addition, because the thickness of the first electrode layer 190 on the edge portion 182 gradually decreases in the direction approaching the stage portion 181, and the thickness of the first electrode layer 190 positioned at the edges of the auxiliary layer 180 is same as the thickness of the first electrode layer 190 on the third light-emitting unit layer 173, the transmittance of the display panel smoothly transitions at the junction of one of the pixel areas PA and one of the transmitting areas TA and gradually increases in the direction away from one of the pixel areas PA. The blocking strength of the first electrode layer 190 to light emitted by the third light-emitting unit layer 173 smoothly transitions at the junction of one of the pixel areas PA and one of the transmitting areas TA, and gradually decreases in the direction away from one of the pixel areas PA, so the brightness uniformity of the display panel is further increased under a premise of ensuring the transmittance of the display panel.

As shown in FIGS. 6 and 7, the first electrode layer 190 is not disposed on the stage portion 181 of the auxiliary layer 180 in each of the transmitting areas TA. This causes the first electrode layer 190 to be discontinuous in each of the transmitting areas TA, which increases a resistivity of the first electrode layer 190 and further increases the voltage drop of the entire display panel. As shown in FIG. 8, the first electrode layer 190 on the auxiliary layer 180 in each of the transmitting areas TA is smaller than the first electrode layer 190 on the third light-emitting unit layer 173, so that the resistivity of the first electrode layer 190 in each of the transmitting areas TA is greater than resistivities of other areas, which also increases the voltage drop of the entire display panel.

As shown in FIGS. 3-8, the transparent auxiliary electrode layer 200 is disposed on the first electrode layer 190, at least covers part of the auxiliary layer 180, and is electrically connected to the first electrode layer 190 for assisting the first electrode layer 190 to provide the electrical signals for the display panel. The resistivity of the first electrode layer 190 is reduced, so the voltage drop of the display panel is reduced without affecting the transmittance of the display panel in the transmitting areas. A material of the transparent auxiliary electrode layer 200 is a transparent conductive material, including, but not limited to indium tin oxide, indium zinc oxide, aluminum oxide tin, aluminum oxide zinc, indium gallium zinc oxide, etc. A thickness of the transparent auxiliary electrode layer 200 ranges from 20 to 200 nanometers. A reflective index of transparent auxiliary electrode layer 200 ranges from 1.8 to 2.1.

In an embodiment, as shown in FIG. 3, the transparent auxiliary electrode layer 200 is provided as an entire surface, which means that the transparent auxiliary electrode layer 200 completely covers the first electrode layer 190 and the auxiliary layer 180. In this way, the transparent auxiliary electrode layer 200 is in close contact with the first electrode layer 190. The transparent auxiliary electrode layer 200, as part of a first electrode, provides the electrical signals for the display panel together with the first electrode layer 190. A thickness of the first electrode, including a thickness of the first electrode on the auxiliary layer 180 and a thickness of the first electrode in other areas outside the auxiliary layer 180, is increased by the transparent auxiliary electrode layer 200, which increases a conductivity of an entire first electrode, thereby reducing the voltage drop of the display panel. Furthermore, the transparent auxiliary electrode layer 200 is not limited to being only disposed in the first display area 11. The transparent auxiliary electrode layer 200 can also extend into the second display area 12 and cover the first electrode layer in the second display area 12, so as to increase the conductivity of the first electrode layer in the second display area 12 and further reduce the voltage drop of the display panel.

Because the transparent auxiliary electrode layer 200 requires a higher temperature during a production process, the higher temperature adversely affects a performance of a luminescent material layer 172. In order to protect the luminescent material layer 172 from being affected during the production process of the transparent auxiliary electrode layer 200, the present application proposes another embodiment. As shown in FIG. 4, the display panel further includes a protective layer 210 disposed between the first electrode layer 190 and the transparent auxiliary electrode layer 200. The protective layer 210 includes a plurality of protective portions arranged at intervals, and each of the protective portions is positioned on a corresponding one of the pixel areas PA and corresponds to one of the light-emitting units in the pixel area PA where it is positioned. A material of the protective layer 210 is a transparent high-temperature resistant material, including, but not limited to silicon oxide, silicon nitride, and silicon oxynitride. By adding the transparent high-temperature resistant protective layer 210 between the first electrode layer 190 and the transparent auxiliary electrode layer 200 and on the luminescent material layer 172, the protective layer 210 blocks a high temperature damage to the luminescent material layer 172 during the production process of the transparent auxiliary electrode layer 200, protects the luminescent material layer 172, and ensures a luminous quality of the display panel.

In another embodiment, as shown in FIG. 5, the transparent auxiliary electrode layer 200 includes a plurality of transparent auxiliary electrodes 200 arranged at intervals. Each of the transparent auxiliary electrodes 200 completely covers the corresponding one of the auxiliary portions 180 and the first electrode layer 190 positioned on the corresponding one of the auxiliary portions 180. This embodiment disposes each of the transparent auxiliary electrodes on each of the auxiliary portions, so each of the transparent auxiliary electrodes is electrically connected to the first electrode layer on each of the auxiliary portions. Each of the transparent auxiliary electrodes, as part of the first electrode, provides the electrical signals for the display panel together with the first electrode layer, which compensates for the thinning or removal of the first electrode layer in each of the transmitting areas, increases the conductivity of the first electrode, and reduces the voltage drop of the display panel. Compared with the embodiments shown in FIGS. 3 and 4, this embodiment reduces an area of the transparent auxiliary electrode layer and reduces material costs of the transparent auxiliary electrode layer. Furthermore, as shown in FIGS. 6-8, each of the transparent auxiliary electrodes 200 covers the first electrode layer 190 on each of the auxiliary portions 180 and each of the auxiliary portions 180 and extends to a periphery of each of the auxiliary portions 180 to cover part of the first electrode layer 190 on the third light-emitting unit layer 173. A distance of each of the transparent auxiliary electrodes 200 extending beyond each of the auxiliary portions 180 ranges from 2 to 5 micrometers, which means that a distance L3 between an edge of one of the transparent auxiliary electrodes 200 and an edge of the corresponding one of the auxiliary portions 180 ranges from 2 to 5 micrometers. This ensures that each of the transparent auxiliary electrodes 200 is in good contact with the first electrode layer 190, and prevents poor electrical contact that may be caused by one of the transparent auxiliary electrodes 200 being only in contact with the first electrode layer 190 on one of the auxiliary portions 180.

In yet another embodiment, the transparent auxiliary electrode layer includes a plurality of transparent auxiliary electrodes arranged at intervals. Each of the transparent auxiliary electrodes can only cover part of the corresponding one of the auxiliary portions and part of the first electrode layer positioned on the corresponding one of the auxiliary portions, and does not need to completely cover the corresponding one of the auxiliary portions and the first electrode layer positioned on the corresponding one of the auxiliary portions. For example, each of the transparent auxiliary electrodes is a cross-shaped electrode or a strip-shaped electrode, and the cross-shaped electrode or the strip-shaped electrode only covers part of each of the auxiliary portions. Similarly, in this embodiment, by disposing one of the transparent auxiliary electrodes on part of one of the auxiliary portions, each of the transparent auxiliary electrodes is electrically connected to the first electrode layer on each of the auxiliary portions and provides the electrical signals for the display panel together with the first electrode layer, which increases the conductivity of the first electrode layer and reduces the voltage drop of the display panel.

Figure 9:
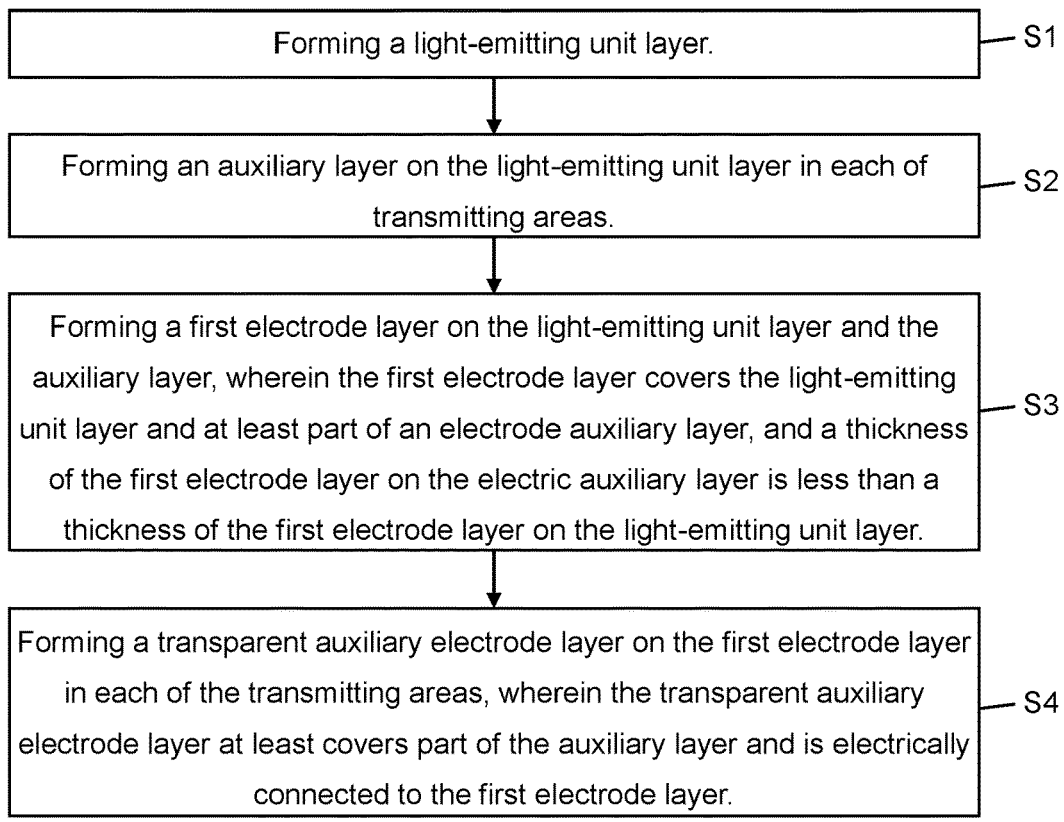
FIG. 9 is a flowchart of a manufacturing method of the display panel provided by an embodiment of the present application.

The present application further provides a manufacturing method of the display panel, which is configured to manufacture the display panel provided by any embodiment of the present application. Please refer to FIG. 9, which shows a flowchart of the manufacturing method of the display panel provided by an embodiment of the present application. The manufacturing method includes:

S1, forming the light-emitting unit layer.

Specifically, the first light-emitting unit layer is vapor-deposited on the pixel defining layer. The first light-emitting unit layer is provided as a whole layer, covers pixel areas and transmitting areas, is deposited on the pixel defining layer, covers the pixel defining layer, and is in contact with the second electrodes. The first light-emitting unit layer is the hole transport layer or a composite film layer of the hole transport layer and the hole injection layer. The hole transport layer is positioned between the hole injection layer and the second electrode layer. The second light-emitting unit layer is vapor-deposited on the first light-emitting unit layer in each of the pixel areas PA. The second light-emitting unit layer corresponds to each of the second electrodes in each of the pixel areas where it is positioned. The second light-emitting unit layer is the light-emitting material layer including the red light-emitting material layer, the green light-emitting material layer, and the blue light-emitting material layer. The third light-emitting unit layer is vapor-deposited on the first light-emitting unit layer and the second light-emitting unit layer. The third light-emitting unit layer is provided as a whole layer and covers the pixel areas and the transmitting areas. The third light-emitting unit layer is the electron transport layer or the composite film layer of the electron transport layer and the electron injection layer, and the electron injection layer is positioned between the electron transport layer and the luminescent material layer.

S2, forming the auxiliary layer on the light-emitting unit layer in each of the transmitting areas.

Specifically, the auxiliary layer is formed on the third light-emitting unit layer by a set of precision masks to form the auxiliary portions spaced apart and independent of each other. Each of the auxiliary portions is positioned in the corresponding one of the transmitting areas. Each of the auxiliary portions includes the stage portion and the edge portion positioned at the edges of the stage portion. The thickness of the edge portion gradually decreases in the direction away from the stage portion. The width of the projection of the edge portion on the third light-emitting unit layer ranges from 2 to 5 micrometers. The contact angle between the auxiliary layer and the third light-emitting unit layer ranges from 0 to 90 degrees. The material of the auxiliary layer 180 is the transparent anti-adhesion material, and specifically is the material having the weak adhesion force with the first electrode layer and surface energy mismatching with the first electrode layer.

S3, forming the first electrode layer on the light-emitting unit layer and the auxiliary layer, wherein the first electrode layer covers the light-emitting unit layer and at least part of the electrode auxiliary layer, and the thickness of the first electrode layer on the electric auxiliary layer is less than the thickness of the first electrode layer on the light-emitting unit layer.

Specifically, the first electrode layer is deposited on the third light-emitting unit layer and auxiliary layer. The material of the auxiliary layer is the anti-adhesion material, and the anti-adhesion material mismatches with the surface energy of the material of the first electrode layer. Also, the material of the third light-emitting unit layer is the non-anti-adhesion material, which matches the surface energy of the material of the first electrode layer. In this way, the adhesion force of the first electrode layer on the auxiliary layer is less than an adhesion force of the first electrode layer on the third light-emitting unit layer. Therefore, the thickness of the first electrode layer on the auxiliary layer is less than the thickness of the first electrode layer on the third light-emitting unit layer.

S4, forming the transparent auxiliary electrode layer on the first electrode layer in each of the transmitting areas, wherein the transparent auxiliary electrode layer at least covers part of the auxiliary layer and is electrically connected to the first electrode layer.

Specifically, in an embodiment, the transparent auxiliary electrode layer is formed on the first electrode layer as a whole layer. The transparent auxiliary electrode layer completely covers the first electrode layer and auxiliary layer. Each of the transparent auxiliary electrodes is attached and electrically connected to the first electrode layer, and as part of the first electrode, provides the electrical signals for the display panel together with the first electrode layer. The thickness of the first electrode, including the thickness of the first electrode on the auxiliary layer and the thickness of the first electrode in other areas outside the auxiliary layer, is increased by the transparent auxiliary electrode layer, which increases the conductivity of the entire first electrode, thereby reducing the voltage drop of the display panel. Furthermore, the manufacturing method further includes forming the protective layer at a position corresponding to the luminescent material layer on the first electrode layer in each of the pixel areas before forming the transparent auxiliary electrode layer. The material of the protective layer is the transparent high-temperature resistant material to protect the luminescent material layer from damage during the production process of the transparent auxiliary electrode layer. In another embodiment, each of the transparent auxiliary electrodes is formed on each of the auxiliary portions. Transparent auxiliary electrodes are arranged at intervals, and each of the transparent auxiliary electrodes completely covers the corresponding one of the auxiliary portions and the first electrode layer positioned on the corresponding one of the auxiliary portions. Each of the transparent auxiliary electrodes is electrically connected to the first electrode layer on each of the auxiliary portions. Each of the transparent auxiliary electrodes, as part of the first electrode, provides the electrical signals for the display panel together with the first electrode layer, which compensates for the thinning or removal of the first electrode layer in each of the transmitting areas, increases the conductivity of the first electrode, and reduces the voltage drop of the display panel. Furthermore, each of the transparent auxiliary electrodes extends to the periphery of each of the auxiliary portions and covers part of the first electrode layer on the third light-emitting unit layer. The distance of each of the transparent auxiliary electrodes extending beyond each of the auxiliary portions ranges from 2 to 5 micrometers, which ensures that each of the transparent auxiliary electrodes is in good contact with the first electrode layer, and prevents poor electrical contact that may be caused by one of the transparent auxiliary electrodes being only in contact with the first electrode layer on one of the auxiliary portions.

The manufacturing method of the display panel provided by an embodiment of the present application forms the transparent auxiliary electrode layer on the first electrode layer. The transparent auxiliary electrode layer at least covers part of the auxiliary layer and is electrically connected to the first electrode layer, so that the transparent auxiliary electrode layer can assist the first electrode layer to provide the electrical signals for the display panel. The conductivity of the first electrode layer is increased without affecting the transmittance of the display panel in the transmitting areas, and the voltage drop of the display panel is reduced.

In an embodiment, the present application further provides a display device. The display device includes any type of the display panel provided in the embodiments of the present application and has the technical features and technical effects of any type of the display panel provided in the embodiments of the present application. For specific implementation and working principles, please refer to the above-mentioned specific embodiments, which are not repeatedly described herein.

In summary, the present application provides the display panel, the manufacturing method thereof, and the display device. The display panel adds the transparent auxiliary electrode layer on the first electrode layer, and the transparent auxiliary electrode layer completely covers the auxiliary layer and is electrically connected to the first electrode layer, so that the transparent auxiliary electrode layer can assist the first electrode layer to provide electrical signals for the display panel. The conductivity of the first electrode layer is increased without affecting the transmittance of the display panel in the transmitting areas, and the voltage drop of the display panel is reduced.

The display panel and the display device provided by the present application is described in detail above, the specific examples of this document are used to explain principles and embodiments of the present application, and the description of embodiments above is only for helping to understand the present application. Meanwhile, those skilled in the art will be able to change the specific embodiments and the scope of the present application according to the idea of the present application. In the above, the content of the specification should not be construed as limiting the present application. Above all, the content of the specification should not be the limitation of the present application.

What is claimed is:

1. A display panel, comprising a first display area and a second display area, wherein a transmittance of the first display area is greater than a transmittance of the second display area; and
    wherein the display panel further comprises:
        pixel areas and transmitting areas positioned between the pixel areas in the first display area;
        a light-emitting unit layer comprising light-emitting units disposed in the pixel areas;
        an auxiliary layer disposed in the transmitting areas;
        a first electrode layer covering the light-emitting unit layer and at least part of the auxiliary layer, wherein a thickness of the first electrode layer on the auxiliary layer is less than a thickness of the first electrode layer on the light-emitting unit layer; and
        a transparent auxiliary electrode layer at least covering part of the auxiliary layer and electrically connected to the first electrode layer.

2. The display panel according to claim 1, wherein the transparent auxiliary electrode layer completely covers the auxiliary layer.

3. The display panel according to claim 2, wherein the transparent auxiliary electrode layer completely covers the first electrode layer.

4. The display panel according to claim 3, wherein the transparent auxiliary electrode layer extends into the second display area.

5. The display panel according to claim 1, wherein the transparent auxiliary electrode layer comprises a plurality of transparent auxiliary electrodes arranged at intervals, the auxiliary layer comprises a plurality of auxiliary portions arranged at intervals, each of the auxiliary portions is positioned in a corresponding one of the transmitting areas, and each of the transparent auxiliary electrodes at least covers part of a corresponding one of the auxiliary portions and part of the first electrode layer on the corresponding one of the auxiliary portions.

6. The display panel according to claim 5, wherein each of the transparent auxiliary electrodes completely covers the corresponding one of the auxiliary portions and the first electrode layer positioned on the corresponding one of the auxiliary portions.

7. The display panel according to claim 6, wherein each of the transparent auxiliary electrodes further covers part of the first electrode layer positioned at a periphery of the corresponding one of the auxiliary portions.

8. The display panel according to claim 7, wherein a distance between an edge of each of the transparent auxiliary electrodes and an edge of the corresponding one of the auxiliary portions ranges from 2 to 5 micrometers.

9. The display panel according to claim 6, wherein each of the auxiliary portions comprises a stage portion and an edge portion positioned at an edge of the stage portion, a thickness of the edge portion gradually decreases in a direction away from the stage portion, the first electrode layer at least covers part of the edge portion, and a thickness of the first electrode layer gradually decreases on the edge portion in a direction in which the thickness of the edge portion increases.

10. The display panel according to claim 9, wherein on the auxiliary layer, the first electrode layer covers part of the edge portion.

11. The display panel according to claim 9, wherein on the auxiliary layer, the first electrode layer completely covers the edge portion.

12. The display panel according to claim 9, wherein on the auxiliary layer, the first electrode layer completely covers the edge portion and the stage portion.

13. The display panel according to claim 1, further comprising a protective layer disposed between the first electrode layer and the transparent auxiliary electrode layer and comprising a plurality of protective portions arranged at intervals;
    wherein each of the protective portions is positioned in a corresponding one of the pixel areas; and
    wherein the light-emitting unit layer comprises the light-emitting units arranged at intervals, each of the light-emitting units is positioned in the corresponding one of the pixel areas, and each of the protective portions corresponds to each of the light-emitting units.

14. The display panel according to claim 13, wherein a projection of each of the light-emitting units on the first electrode layer is positioned in a projection of each of the protective portions on the first electrode layer, and an area of each the light-emitting units is less than or equal to an area of each of the protective portions.

15. The display panel according to claim 1, further comprising a pixel defining layer patterned to form a plurality of pixel openings arranged at intervals;
wherein each of the pixel openings is positioned in a corresponding one of the pixel areas, the auxiliary layer comprises a plurality of auxiliary portions arranged at intervals, each of the auxiliary portions is positioned in a corresponding one of the transmitting areas, and a distance between an edge of each of the auxiliary portions and an edge of adjacent one of the pixel openings ranges from 2 to 5 micrometers.

16. The display panel according to claim 1, wherein a thickness of the transparent auxiliary electrode layer ranges from 20 to 200 nanometers.

17. The display panel according to claim 1, wherein a refractive index of the transparent auxiliary electrode layer ranges from 1.8 to 2.1.

18. A display device, comprising a display panel, wherein the display panel comprises a first display area and a second display area, and a transmittance of the first display area is greater than a transmittance of the second display area; and
wherein the display panel further comprises:
pixel areas and transmitting areas positioned between the pixel areas in the first display area;
a light-emitting unit layer comprising light-emitting units disposed in the pixel areas;
an auxiliary layer disposed in the transmitting areas;
a first electrode layer covering the light-emitting unit layer and at least part of the auxiliary layer, wherein a thickness of the first electrode layer on the auxiliary layer is less than a thickness of the first electrode layer on the light-emitting unit layer; and
a transparent auxiliary electrode layer at least covering part of the auxiliary layer and electrically connected to the first electrode layer.

19. The display device according to claim 18, wherein the transparent auxiliary electrode layer completely covers the auxiliary layer.

20. The display device according to claim 19, wherein the transparent auxiliary electrode layer completely covers the first electrode layer.

* * * * *